(12) United States Patent
Kuznetsov

(10) Patent No.: US 10,335,829 B2
(45) Date of Patent: Jul. 2, 2019

(54) DEVICE FOR GENERATING MECHANICAL VIBRATIONS

(71) Applicant: OBSHCHESTVO S OGRANICHENNOY OTVETSTVENNOSTYU "RENK", Moscow (RU)

(72) Inventor: Andrey Leonidovich Kuznetsov, Moscow (RU)

( * ) Notice: Subject to any disclaimer, the term of this patent is extended or adjusted under 35 U.S.C. 154(b) by 258 days.

(21) Appl. No.: 15/271,344

(22) Filed: Sep. 21, 2016

(65) Prior Publication Data
US 2017/0008031 A1   Jan. 12, 2017

Related U.S. Application Data

(63) Continuation of application No. PCT/RU2014/000230, filed on Mar. 31, 2014.

(51) Int. Cl.
*B06B 1/06* (2006.01)
*H01L 41/083* (2006.01)
*H01L 41/09* (2006.01)

(52) U.S. Cl.
CPC .......... *B06B 1/0611* (2013.01); *H01L 41/083* (2013.01); *H01L 41/0906* (2013.01); *B06B 2201/55* (2013.01)

(58) Field of Classification Search
CPC .. B06B 1/0611; H01L 41/083; H01L 41/0906
USPC ................ 310/358; 252/62.9 R, 62.9 PZ
See application file for complete search history.

(56) References Cited

U.S. PATENT DOCUMENTS

| 3,171,989 A | | 3/1965 | Rudolf | |
|---|---|---|---|---|
| 3,913,537 A | * | 10/1975 | Ziesche | F02D 41/3005 123/484 |
| 4,814,659 A | * | 3/1989 | Sawada | F02M 47/02 310/323.17 |
| 6,077,285 A | * | 6/2000 | Boukhny | A61F 9/00745 604/22 |
| 8,004,158 B2 | | 8/2011 | Hielscher | |

(Continued)

OTHER PUBLICATIONS

International Search Report with regard to PCT/RU2014/000230 dated Dec. 18, 2014.

*Primary Examiner* — Derek J Rosenau

(57) ABSTRACT

There is disclosed a mechanical-vibration-generating-device for generating a mechanical vibration, the mechanical vibration having a vibration direction. The mechanical-vibration-generating-device comprises: rigid bushings comprising at least a beginning rigid bushing and a end rigid bushing, at least one axial piezoelectric stack positioned between the beginning rigid bushing and the end rigid bushing, the at least one axial piezoelectric stack having an imaginary axis; the imaginary axis being aligned with the vibration direction, a coupling for interconnecting the beginning rigid bushing and the end rigid bushing, a common internal channel defined in the rigid bushings and the piezoelectric stack, the first connective passage and the second connective passage defined in the rigid bushings providing a fluid path between the common internal channel and an ambient environment, the first connective passage having a first valve and the second connective passage having a second valve, the first valve being configured as an inlet valve and the second valve being configured as an outlet valve.

11 Claims, 4 Drawing Sheets

(56) References Cited

U.S. PATENT DOCUMENTS

2006/0126884 A1      6/2006  Hielscher
2012/0209166 A1*     8/2012  Power ................. A61M 11/005
                                                         604/24
2015/0221854 A1*     8/2015  Melz .................... H01L 41/053
                                                         310/328

* cited by examiner

B - B

C - C

… (1)

DEVICE FOR GENERATING MECHANICAL VIBRATIONS

CROSS-REFERENCE

The present application is a continuation of International Patent Application no. PCT/RU2014/000230, filed on Mar. 31, 2014, entitled "DEVICE FOR GENERATING MECHANICAL VIBRATIONS". This application is incorporated by reference herein in its entirety.

FIELD OF THE TECHNOLOGY

The invention relates to devices for generating a mechanical vibration, and can be used in industry, transportation and housekeeping in ultrasonic welding and cleaning apparatus, echolocation equipment, piezoelectric stepper motors.

BACKGROUND OF THE TECHNOLOGY

There is a known mechanical-vibration-generating device described in the U.S. Pat. No. 8,004,158 published on Jun. 15, 2006. U.S. Pat. No. 8,004, 58 discloses a method and a device for cooling ultrasonic transducers. The device is characterized in that it consists of at least one piezo stack (4) and at least two cylindrical transducer bodies (5), which together with the piezo stack (4) form an λ/2 oscillator. In multiple transducer assemblies, two respective transducer bodies (5) can be combined to form a common transducer body (6) and the transducer bodies (5, 6) comprise flow channels (7), through which pressurized coolant can flow. The inventive method for cooling ultrasonic transducers is characterized in that the body of the ultrasonic transducer is traversed and/or surrounded by a pressurized coolant. This enables the heat that is generated in the transducers to be directly dissipated by convection. In addition the inventive elements enable the creation of a large common contact surface between the transducers and the coolant. The heat dissipation achieved is substantially more effective than in known methods and the inventive elements thus guarantee a high-performance continuous operation.

The device is in fluid. The fluid provides cooling of the warmed piezoelectric stacks. The fluid enters into the connective passage in the beginning bushing. Then the fluid passes to the common internal channel and exits from the connective passage in the end bushing.

However the pump or other similar means providing flow of fluid in the common internal channel and the connective passages is necessary for operation of this device. It complicates a design, increases its mass and volume.

SUMMARY OF THE TECHNOLOGY

Thus, the technical problem to be solved by the present technical solution is to eliminate the above mentioned disadvantages and simplify the device structure. The positive effect achieved with the embodiments of the present technology is to reduce the mass and volume of the device and to enhance the reliability of its operation.

For the solution of the technical problem with achievement of a positive effect the design of the known device for generating a mechanical vibration is changed. The present mechanical-vibration-generating device has a vibration direction. The mechanical-vibration-generating-device comprises rigid bushings comprising at least a beginning rigid bushing and an end rigid bushing, wherein at least one axial piezoelectric stack positioned between the beginning rigid bushing and the end rigid bushing, the at least one axial piezoelectric stack has an imaginary axis. The imaginary axis is aligned with the vibration direction.

Furthermore, a coupling for interconnecting the beginning rigid bushing and the end rigid bushing in the direction of the imaginary axis of the piezoelectric stack is provided. A common internal channel is defined in rigid bushings and the piezoelectric stack. The first connective passage and the second connective passage defined in the rigid bushings provide a fluid path between the common internal channel and an ambient environment. The first connective passage has a first valve and the second connective passage has a second valve. The first valve is configured as an inlet valve and the second valve is configured as an outlet valve.

The first valve and the second valve may be flap valves or electrically operated valves. The electrically operated valves may be piezoelectric valves. Also the mechanical vibration generating device may have a screw located in the common internal channel or a screw located outside of the piezoelectric stack as the coupling. The coupling may be defined as a casing, connected to the beginning rigid bushing and the end rigid bushing such that the axial piezoelectric stack is housed inside of the casing.

The axial piezoelectric stack is operatively coupled to a source of voltage pulses to selectively change thickness thereof in proportion to the voltage. During the operation of the device its piezoelectric stack alternately increases and decreases its length. That provides the mechanical vibration to a work piece operatively associated with the mechanical-vibration-generating-device. Also that causes decrease and increase in volume of the fluid in the common internal channel, and selective opening of the inlet valve and the outlet valve for causing the cooling fluid to move mainly in one direction in the common internal channel inside the piezoelectric stack. Therefore there is no need for the pump or other similar means supplying fluid to the connective passage for cooling of the warming piezoelectric stacks in the proposed design.

Due to the new design of the device for generating a mechanical vibration it is possible to reduce its mass and volume.

As such, in accordance with a first broad aspect of the present technology, there is provided a mechanical-vibration-generating-device for generating a mechanical vibration, the mechanical vibration having a vibration direction. The mechanical-vibration-generating-device comprises: rigid bushings comprising at least a beginning rigid bushing and an end rigid bushing, at least one axial piezoelectric stack positioned between the beginning rigid bushing and the end rigid bushing, the at least one axial piezoelectric stack having an imaginary axis; the imaginary axis being aligned with the vibration direction, a coupling for interconnecting the beginning rigid bushing and the end rigid bushing in the direction of the imaginary axis of the piezoelectric stack, a common internal channel defined in the rigid bushings and the piezoelectric stack, the rigid bushings defining a first connective passage a second connective passage, the first connective passage and the second connective passage providing a fluid path between the common internal channel and an ambient environment, the first connective passage having a first valve and the second connective passage having a second valve, the first valve being configured as an inlet valve and the second valve being configured as an outlet valve.

In some implementations of the mechanical-vibration-generating-device, at least one of the first valve and the second valve comprises a flap valve.

In some implementations of the mechanical-vibration-generating-device, at lest one of the first valve and the second valve comprises an electrically operated valve.

In some implementations of the mechanical-vibration-generating-device, the electrically operated valve comprises a piezoelectric valve.

In some implementations of the mechanical-vibration-generating-device, the coupling comprises a screw located in the common internal channel.

In some implementations of the mechanical-vibration-generating-device, the coupling comprises a screw located outside of the piezoelectric stack.

In some implementations of the mechanical-vibration-generating-device, the coupling comprises a casing, the casing being connected to the beginning rigid bushing and the end rigid bushing such that the axial piezoelectric stack is housed inside of the casing.

In some implementations of the mechanical-vibration-generating-device, the at least one axial piezoelectric stack comprises a series of electrode plates.

In some implementations of the mechanical-vibration-generating-device, the mechanical-vibration-generating-device further comprises at least one intermediate rigid bushing located in-between the beginning rigid bushing and the end rigid bushing.

In some implementations of the mechanical-vibration-generating-device, the at least one axial piezoelectric stack is operatively coupled to a source of voltage pulses to selectively change thickness thereof in proportion to the voltage, such that the at least one axial piezoelectric stack selectively increases and decreases its length such that to provide the mechanical vibration to a work piece operatively associated with the mechanical-vibration-generating-device of.

In some implementations of the mechanical-vibration-generating-device, the inlet valve is coupled to a source of a cooling fluid for circulating the cooling fluid between the inlet valve, via the common internal channel, and the outlet valve for cooling, in use, the at least one axial piezoelectric stack and wherein: changes in the thickness of the at least one axial piezoelectric stack further causes selective opening of the inlet valve and the outlet valve for causing the cooling fluid to move.

In some implementations of the mechanical-vibration-generating-device, the inlet valve is coupled to a source of a cooling fluid for circulating the cooling fluid between the inlet valve, via the common internal channel, and the outlet valve for cooling, in use, the at least one axial piezoelectric stack.

In some implementations of the mechanical-vibration-generating-device, a fluid passage defined by the inlet valve, the common internal channel, and the outlet valve is selectively hermetically sealed.

BRIEF DESCRIPTION OF THE DRAWINGS

The abovementioned advantages of the invention and its features are explained with reference to non-limiting embodiments with reference to the drawings attached herewith, in which drawings:

FIG. 1 further depicts a coupling for interconnecting the beginning and the end rigid bushings (the coupling being implemented a screw located in the common internal channel).

DETAILED DESCRIPTION OF THE NON-LIMITING EMBODIMENTS

Figure 1:
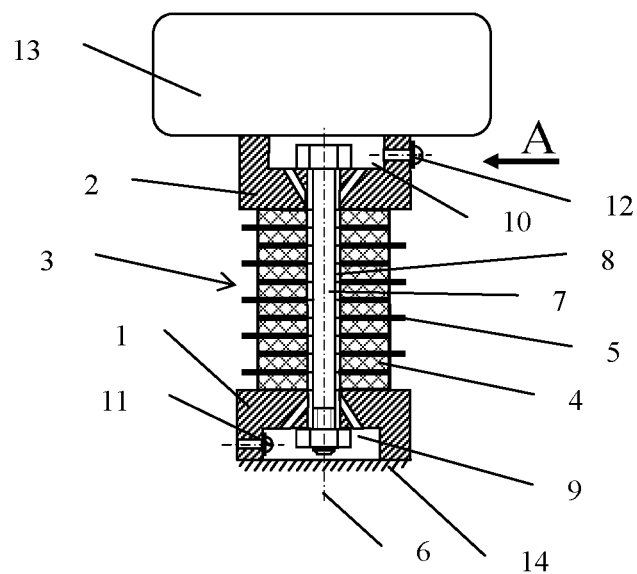
FIG. 1 depicts a longitudinal cross-section of a device for generating a mechanical vibration, the device being implemented in accordance with a non-limiting embodiment of the present technology.

In accordance to a first non-limiting embodiment of the present technology, a device for generating of a mechanical vibration represented in a longitudinal cross-section in FIG. 1 comprises a beginning rigid bushing 1 and an end rigid bushing 2, and also an axial piezoelectric stack 3 positioned between the beginning rigid bushing 1 and the end rigid bushing 2. The axial piezoelectric stack 3 has an imaginary axis 6. The piezoelectric stack 3 comprises a series of rings 4 made of piezoelectric material, for example, a piezoelectric ceramics. The piezoelectric stack 3 also comprises a series of the electrode plates 5 of the ring shape; each electrode plate 5 is located between rings 4. The electrode plates 5 are connected by the electric wires which are not shown in the drawing by the known principle used at assembly of piezoelectric stacks. Rings 4 are polarized in the direction of imaginary axis 6 of a piezoelectric stack 3. Therefore the imaginary axis 6 is aligned with the direction of a mechanical vibration.

The beginning rigid bushing 1 and the end rigid bushing 2 are connected by a coupling for interconnecting the beginning rigid and the end rigid bushings in the direction of the imaginary axis 6 of the piezoelectric stack 3. Such coupling can be a screw 7 fixed by its head in the beginning rigid bushing 1. The screw 7 places in the holes in the rings 4 and the electrode plates 5 of the piezoelectric stack 3 and in the end rigid bushing 2. The screw 7 is fixed in the end rigid bushing 2 by a thread connection. At rotation of the screw 7 pulling to each other of the beginning rigid bushing 1 and the end rigid bushing 2 increases, which means the force pressing a piezoelectric stack 3 also increases.

In the rigid bushings 1, 2 and in the piezoelectric stack 3 a common internal channel 8 is comprised. The screw 7, the holes in rings 4 and electrode plates 5 define the channel 8 in a piezoelectric stack 3. The connective passage 9 which provides a fluid path between the common internal channel 8 and an ambient environment is comprised in the rigid bushing 1. Furthermore, the connective passage 10 which provides a fluid path between the common internal channel 8 and an ambient environment is comprised in the rigid bushing 2. The connective passage 9 of the rigid bushing 1 has a flap inlet valve 11. The connective passage 10 of the rigid bushing 2 has a flap outlet valve 12.

The connective passage 9 with the inlet valve 11 in it is hermetically sealed from below by the supporting surface 14, that is conditionally fixed during the operation of the device. Instead of the supporting surface 14 any other object can be used, including the movable object. The connective passage 10 with the outlet valve 12 in it is hermetically sealed from above by the work piece 13 operatively associated with the mechanical-vibration-generating-device, which is a load for the working device. During the operation of the device this work piece mechanically vibrates in the axial direction. Another object can be a load for the device.

Figure 2:
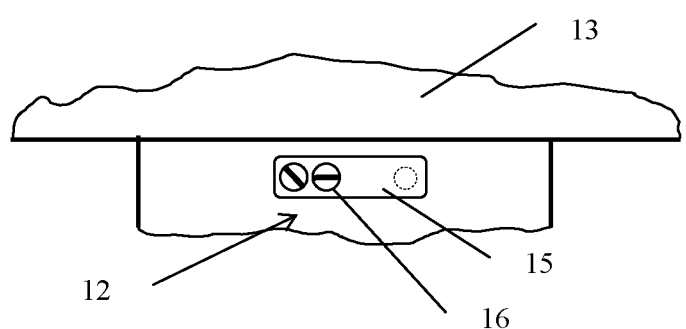
FIG. 2 depicts a view of a flap valve that can be used in the device of FIG. 1.

The view of the flap outlet valve 12 is presented in FIG. 2. The outlet valve 12 comprises a flexible rectangular plate 15 and two fixing screws 16. One end of a flexible rectangular plate 15 blocks an opening of the connective passage 10. The flap inlet valve 11 is of the same design.

Figure 3:
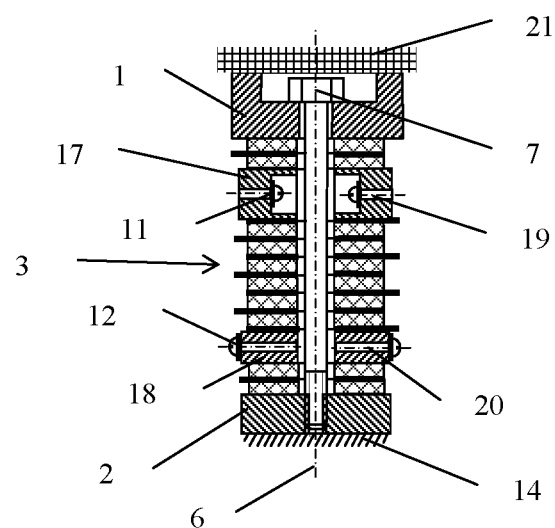
FIG. 3 depicts a longitudinal cross-section of a device for generating a mechanical vibration, the device being implemented in accordance with an alternative non-limiting embodiment of the present technology. A coupling for interconnecting the beginning and the end rigid bushings is implemented as a screw located in the common internal channel.

In accordance to another non-limiting embodiment of the present technology, a device for generating a mechanical vibration represented in a longitudinal section in FIG. 3 comprises the beginning rigid bushing 1, the end rigid bushing 2, the intermediate rigid bushings 17 and 18. Between beginning, end and the intermediate rigid bushings 1, 2, 17 and 18 respectively the three axial piezoelectric stacks 3 are located. The beginning rigid bushing 1 and the end rigid bushing 2 are coupled. Such coupling for interconnecting the beginning rigid bushing 1 and the end rigid bushing 2 in the direction of the imaginary axis 6 of the piezoelectric stack 3 is a screw 7 fixed by its head in the beginning rigid bushing 1. The screw 7 is located in the holes in the rings 4, the intermediate rigid bushings 17 and 18, and also electrode plates 5 of piezoelectric stacks 3, and then at the end rigid bushing 2. The threaded portion of the screw 7 is fixed at the end rigid bushing 2 by a thread connection.

In the device the common internal channel 8 of the ring shape defined by the screw 7, and also holes in rings 4, the beginning rigid bushing 1, the intermediate rigid bushings 17 and 18 and electrode plates 5 is provided. In the intermediate rigid bushing 17 two connective passages 19 which connect the common internal channel 8 to the ambient environment are provided. In the intermediate rigid bushing 18 two connective passages 20 for a fluid path between the common internal channel 8 and an ambient environment are provided.

There is at least one flap inlet valve 11 in the connective passages 19. There is at least one flap outlet valve 12 in the connective passages 20. The object 21 is a load for the working device, perceiving a mechanical vibration. The part of it is represented in the drawing. Also the physical medium can be a load for the device. The end rigid bushing 2 is connected to the supporting surface 14, that is conditionally fixed during the operation of the device. Instead of the supporting surface 14 any other object can be used, including the movable object.

Figure 4:
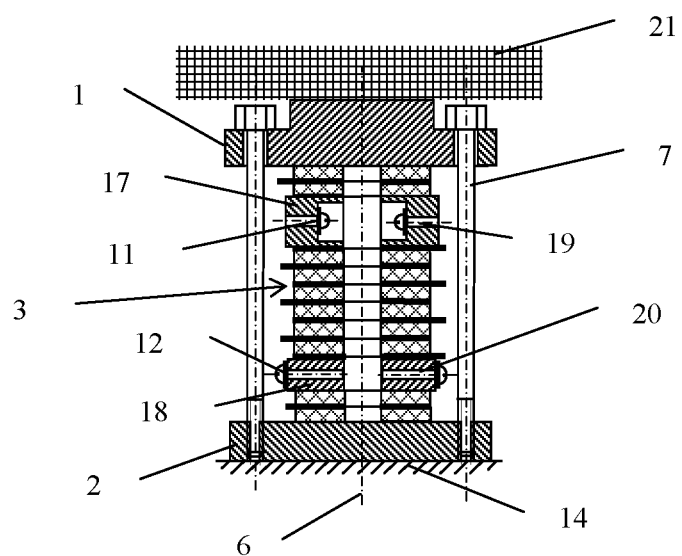
FIG. 4 depicts a longitudinal cross-section of a device for generating a mechanical vibration, the device being implemented in accordance with yet another non-limiting embodiment of the present technology. A coupling for interconnecting the beginning and the end rigid bushings is implemented as screws located outside of the piezoelectric stack.

In accordance to yet another non-limiting embodiment of the present technology, a device for generating a mechanical vibration represented in a longitudinal section in FIG. 4 comprises the beginning rigid bushing 1, the end rigid bushing 2, the intermediate rigid bushings 17 and 18. Between beginning, end and the intermediate rigid bushings 1, 2, 17 and 18 three axial piezoelectric stacks 3 are located.

The beginning rigid bushing 1 and the end rigid bushing 2 are coupled. Such coupling for interconnecting the beginning rigid bushing 1 and the end rigid bushing 2 in the direction of the imaginary axis 6 of the piezoelectric stack 3 are two screws 7 fixed by the heads in the beginning rigid bushing 1, and the threaded portions are fixed in the end rigid bushing 2. Diameters of the beginning rigid bushing 1 and end rigid bushing 2 significantly exceed diameters of piezoelectric stacks 3. Screws 7 are located outside of the piezoelectric stacks 3.

In the device the common internal channel 8 defined by holes in rings 4, the intermediate rigid bushings 17 and 18 and electrode plate 5 is provided. In the intermediate rigid bushing 17 two connective passages 19 for a fluid path between the common internal channel 8 and an ambient environment are provided. In the intermediate rigid bushing 18 two connective passages 20 for a fluid path between the common internal channel 8 and an ambient environment are provided.

There is a flap inlet valve 11 in each connective passage 19. There is a flap outlet valve 12 in each connective passage 20.

The object 21 is a load for the working device, perceiving a mechanical vibration. The part of it is represented in the drawing. Also physical medium can be a load for the device. The end rigid bushing 2 is connected to the supporting surface 14, that is conditionally fixed during the operation of the device. Instead of the supporting surface 14 any other object can be used, including a movable object.

Figure 5:
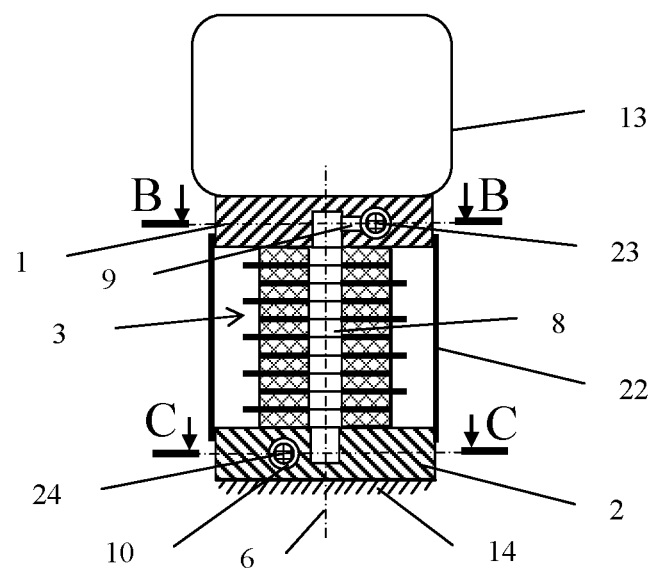
FIG. 5 depicts a longitudinal cross-section of a device for generating a mechanical vibration, the device implemented in accordance with yet another non-limiting embodiment of the present technology. A coupling for interconnecting the beginning and the end rigid bushings is implemented as a casing located outside of the piezoelectric stack.

In accordance to yet another non-limiting embodiment of the present technology, a device for generating a mechanical vibration represented in a longitudinal section in FIG. 5 comprises the beginning rigid bushing 1 and the end rigid bushing 2. Between beginning and end rigid bushings 1 and 2 the axial piezoelectric stack 3 is located. The beginning rigid bushing 1 and the end rigid bushing 2 are coupled. Such coupling for interconnecting the beginning rigid bushing 1 and the end rigid bushing 2 in the direction of the imaginary axis 6 of the piezoelectric stack 3 is the casing 22 fixed on the beginning rigid bushing 1 and on the end rigid bushing 2, such that the axial piezoelectric stack 3 is housed inside of the casing 22. The casing 22 is fixed on rigid bushings by welding, soldering, thread connection or any similar way.

The common internal channel 8 defined by holes in the beginning rigid bushing 1, the piezoelectric stack 3 and the end rigid bushing 2 is provided in the device. The connective passage 9 which connect the internal channel 8 to the ambient environment is made in the rigid bushing 1. Furthermore, the connective passage 10 which connect the internal channel 8 to the ambient environment is provided in the rigid bushing 2.

The connective passage 9 of the beginning rigid bushing 1 has an inlet valve 23 of piezoelectric type. The connective passage 10 of the rigid bushing 2 has an outlet valve 24 of piezoelectric type. The beginning rigid bushing 1 is connected to the work piece 13 which is loading for the device when it works. During working of the device this body performs a mechanical vibration in the axial direction. Any other object or physical medium can also be the loading for the device. The end rigid bushing 2 is connected from below to the supporting surface 14 that is conditionally fixed during the operation of the device. Instead of the supporting surface 14 any other object can be used, including a movable object.

Figure 6:
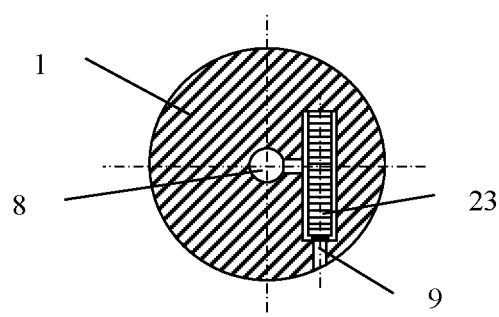
FIG. 6 depicts a cross-section of a rigid bushing with a piezoelectric inlet valve, the rigid bushing being implemented in accordance with non-limiting embodiments of the present technology.
Figure 7:
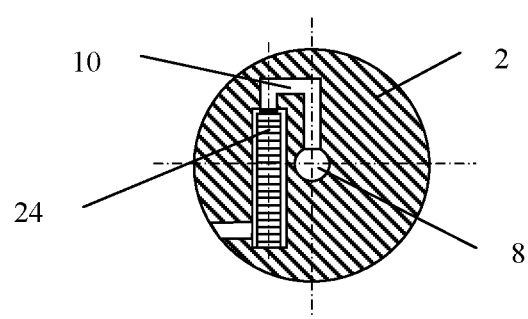
FIG. 7 depicts a cross-section of a rigid bushing with the piezoelectric outlet valve, the rigid bushing being implemented in accordance with non-limiting embodiments of the present technology.

The cross section of the beginning rigid bushing 1 with a piezoelectric inlet valve 23, located in the connective passage 9, is depicted in FIG. 6. The wires controlling a piezoelectric inlet valve 23 are not shown. The cross section of the end rigid bushing 2 with the piezoelectric outlet valve 24, located in connective passage 10, is represented in FIG. 7. The wires controlling the piezoelectric outlet valve 24 are not shown.

The ambient environment, the common internal channel 8 (FIG. 1, 3, 4), the connective passages 9 and 10 (FIG. 1, 4), the connective passages 19 and 20 (FIG. 3) are filled with a cooling fluid. Liquid, gas, an emulsion, suspension, foam may be such fluid.

A fluid passage defined by the inlet valve, the common internal channel, and the outlet valve is selectively hermetically sealed.

In accordance with some implementations of the present technology, the device for generating a mechanical vibration works as follows.

Voltage pulses are supplied from a source of voltage pulses to the rings 4 of the piezoelectric stacks 3 (FIG. 1, 3, 4) through wires (not shown) and electrode plates 5. Due to properties of the piezoelectric material the rings 4 change their thickness thereof in proportion to the voltage. Therefore, the piezoelectric stack 3 alternately increases and decreases its length such that to provide the mechanical vibration to a work piece 13 (FIG. 1, 4) or object 21 (FIG. 3) which are the load for the device.

Furthermore, change of length of the piezoelectric stack 3 causes alternate decrease and increase in volume of the fluid in the common internal channel 8. Inlet flap valves 11 (FIG. 1, 3) and outlet flap valves 12, alternately opening and closing due to pressure difference in the common internal channel 8 and ambient environment, provide cooling fluid movement through the common internal channel 8 in one direction.

The controlling voltage coordinated with voltage supplied to the piezoelectric stack 3 from the control unit (it is not shown in the drawings) to the inlet electrically operated valves of piezoelectric type 23 (FIG. 4) and the outlet electrically operated valves of piezoelectric type 24 is supplied. In a phase of decrease of length of the piezoelectric stack 3 the supplied controlling voltage provides an open state of the outlet valve 24 and a closed state of the inlet valve 23. In a phase of increase of length of a piezoelectric stack 3 the controlling voltage provides the closed state of the outlet valve 24 and an opened state of an inlet valve 23. Alternately opening and closing, the valves 23 and 24 provide cooling fluid circulating between the inlet valve 23, via the common internal channel 8, and the outlet valve 24 for cooling.

The fluid enters the common internal channel 8 through a connective passage 9 (FIG. 1, 4), or connecting passages 19 (FIG. 3). The fluid exits from the common internal channel 8 through a connective passage 10 (FIG. 1, 4), or connective passages 20 (FIG. 3). At the same time the fluid bathes the rings 4, the piezoelectric stacks 3 and heats up, taking heat away from them. As rigid bushings 1, 2, 17, 18 (FIG. 1, 3, 4) heat up due to contacting with the rings 4 of the piezoelectric stacks 3, the fluid takes heat away from the rigid bushings 1, 2, 17, 18 also. Due to one-directional movement the heated fluid takes heat away from the device for generating of a mechanical vibration.

Therefore there is no need for the pump or other similar means providing moving of the fluid through the common internal channel 8 (FIG. 1, 3, 4) and connective passages 9, 10 (FIG. 1, 4), 23, 24 (FIG. 2) for cooling the piezoelectric stacks 3 which are warmed during generation of a mechanical vibration in the proposed device.

UTILIZATION IN THE INDUSTRY

Without being so limited, the device for generating a mechanical vibration can be utilized in the industry, transportation and housekeeping in ultrasonic welding and cleaning apparatus, echolocation equipment and piezoelectric stepper motors.

The invention has been disclosed above with references to specific embodiments thereof. Other embodiments may be evident for specialists that do not alter its essence, as it is disclosed herein. Accordingly, the invention should be considered limited in scope only by the following claims.

The invention claimed is:

1. A mechanical-vibration-generating-device for generating a mechanical vibration, the mechanical vibration having a vibrationl direction, the mechanical-vibration-generating-device comprising:
   rigid bushings comprising at least a beginning rigid bushing and an end rigid bushing,
   at least one axial piezoelectric stack positioned between the beginning rigid bushing and the end rigid bushing, the at least one axial piezoelectric stack having an imaginary axis;
   the imaginary axis being aligned with the vibration direction,
   a coupling for interconnecting the beginning rigid bushing and the end rigid bushing in the direction of the imaginary axis of the piezoelectric stack,
   the rigid bushings and the piezoelectric stack defining a common internal channel,
   the rigid bushings defining a first connective passage and a second connective passage, the first connective passage and the second connective passage providing a fluid path between the common internal channel and an ambient environment,
   the first connective passage having a first valve and the second connective passage having a second valve,
   the first valve being configured as an inlet valve and the second valve being configured as an outlet valve,
   the at least one axial piezoelectric stack being configured in response to being supplied with electrical voltage, to change its thickness that causes alternate decrease and increase in volume of the fluid in the common internal channel,
   the inlet valve and outlet valve being configured, in response to decrease and increase in volume of the fluid in the common internal channel, alternately opening and closing due to pressure difference in the common internal channel and ambient environment, and provide cooling fluid movement through the common internal channel in one direction.

2. The mechanical-vibration-generating-device of claim 1, wherein the first valve and the second valve comprises a respective flap valve.

3. The mechanical-vibration-generating-device of claim 1, wherein the coupling comprises a screw located in the common internal channel.

4. The mechanical-vibration-generating-device of claim 1, wherein the coupling comprises a screw located outside of the piezoelectric stack.

5. The mechanical-vibration-generating-device of claim 1, wherein the coupling comprises a casing, the casing being connected to the beginning rigid bushing and the end rigid bushing such that the axial piezoelectric stack is housed inside of the casing.

6. The mechanical-vibration-generating-device of claim 1, wherein the at least one axial piezoelectric stack comprises a series of electrode plates.

7. The mechanical-vibration-generating-device of claim 1, further comprising at least one intermediate rigid bushing located in-between the beginning rigid bushing and the end rigid bushing.

8. The mechanical-vibration-generating-device of claim 1, wherein the at least one axial piezoelectric stack is operatively coupled to a source of voltage pulses to selectively change thickness thereof in proportion to the voltage, such that the at least one axial piezoelectric stack selectively increases and decreases its thickness such that to provide the mechanical vibration to a work piece operatively associated with the mechanical-vibration-generating-device of.

9. The mechanical-vibration-generating-device of claim 8, wherein the inlet valve is coupled to a source of a cooling fluid for circulating the cooling fluid between the inlet valve, via the common internal channel, and the outlet valve for cooling, in use, the at least one axial piezoelectric stack and wherein:

changes in the thickness of the at least one axial piezoelectric stack further causes selective opening of the inlet valve and the outlet valve for causing the cooling fluid to move.

10. The mechanical-vibration-generating-device of claim 1, wherein the inlet valve is coupled to a source of a cooling fluid for circulating the cooling fluid between the inlet valve, via the common internal channel, and the outlet valve for cooling, in use, the at least one axial piezoelectric stack.

11. The mechanical-vibration-generating-device of claim 1, wherein a fluid passage defined by the inlet valve, the common internal channel, and the outlet valve is selectively hermetically sealed.

* * * * *